United States Patent
Heimes et al.

(10) Patent No.: US 6,811,473 B2
(45) Date of Patent: Nov. 2, 2004

(54) PROCESS FOR MACHINING A WAFER-LIKE WORKPIECE

(75) Inventors: Timon Heimes, Tacherting (DE); Hermann Dumm, Burghausen (DE)

(73) Assignee: Siltronic AG Corporate Intellectual Property, Munich (DE)

( * ) Notice: Subject to any disclaimer, the term of this patent is extended or adjusted under 35 U.S.C. 154(b) by 0 days.

(21) Appl. No.: 10/607,626

(22) Filed: Jun. 27, 2003

(65) Prior Publication Data

US 2004/0043709 A1 Mar. 4, 2004

(30) Foreign Application Priority Data

Jul. 4, 2002 (DE) .......................................... 102 30 146

(51) Int. Cl.[7] .............................................. B24B 1/00
(52) U.S. Cl. ............................ 451/57; 451/28; 451/41; 451/60; 451/190; 451/195; 451/285; 451/286; 451/287; 451/288; 451/447
(58) Field of Search .............................. 451/28, 41, 60, 451/285, 286, 287, 288, 190, 195, 447

(56) References Cited

U.S. PATENT DOCUMENTS

| | | | | |
|---|---|---|---|---|
| 4,393,628 A | * | 7/1983 | Ottman et al. | 451/63 |
| 6,196,901 B1 | * | 3/2001 | Minami | 451/63 |
| 6,709,981 B2 | * | 3/2004 | Grabbe et al. | 438/692 |

OTHER PUBLICATIONS

English Patent Abstract of Japan corresponding to JP-05477534.

* cited by examiner

Primary Examiner—Joseph J. Hail, III
Assistant Examiner—Shantese McDonald
(74) Attorney, Agent, or Firm—Collard & Roe, P.C.

(57) ABSTRACT

A process for machining a wafer-like workpiece between two plates, in which material is abraded from the workpiece under the influence of an auxiliary substance supplied and of a pressure acting on the workpiece. In this process, the pressure on the workpiece is significantly reduced and then increased again at least once during the machining of the workpiece, and the supply of the auxiliary substance is reduced as the pressure is increased.

8 Claims, 1 Drawing Sheet

PROCESS FOR MACHINING A WAFER-LIKE WORKPIECE

BACKGROUND OF THE INVENTION

1. Field of the Invention

The invention relates to a process for machining a wafer-like workpiece between two plates of a machining tool. The invention relates in particular to material-removing machining of a semiconductor wafer in a polishing or lapping machine.

2. The Prior Art

When semiconductor wafers are polished, a distinction is drawn between double-side polishing and single-side polishing. The machines used for this purpose are commercially available and are distinguished in particular through the fact that in single-side polishing there is a carrier plate, to which the workpiece is fixed, instead of an upper working wheel covered with polishing cloth. In double-side polishing and lapping, by contrast, there are two working wheels, between which the workpiece is machined, the working wheels only being covered with polishing cloth in the case of double-side polishing. The workpiece is held in a dedicated cutout in a template between the working wheels.

Furthermore, a distinction can be drawn between single-wafer machining and multi-wafer machining, depending on whether one workpiece or a plurality of workpieces simultaneously is/are machined. Due to the high throughputs which can be achieved, the lapping and polishing of semiconductor wafers is generally carried out as multi-wafer machining. The present invention is suitable for both single-wafer machining and multi-wafer machining.

To ensure the desired effect of removing material and improving the flatness of the workpiece, a lapping abrasive is supplied to the workpiece during lapping and a polishing abrasive is supplied to the workpiece during polishing, and the workpiece is acted on by a pressure. The pressure is usually transmitted via a pneumatic, hydraulic or electrical force-transmitting device which presses the upper working wheel or the carrier plate onto the lower working wheel and the workpiece located between them. During the lapping or polishing of the workpiece, at least one of the working wheels or at least the carrier plate is rotated about its center.

Japanese Patent No. JP-05177534 A proposes a process for polishing semiconductor wafers which has an optimized throughput and in which polishing is initially carried out at a relatively high polishing pressure, in order to achieve a high level of material removal, while toward the end of the polishing the polishing pressure is reduced considerably in order to improve the flatness of the polished semiconductor wafers.

SUMMARY OF THE INVENTION

The present invention provides a process for the material-removing machining of planar workpieces with which particularly planar workpieces are obtainable at high throughputs.

The invention relates to a process for machining a wafer-like workpiece between two plates, in which material is abraded from the workpiece under the influence of an auxiliary substance supplied and of a pressure acting on the workpiece, wherein the pressure on the workpiece is significantly reduced and then increased again at least once during the machining of the workpiece, and the supply of the auxiliary substance is reduced as the pressure is increased.

The process is suitable for the material-removing machining of wafer-like workpieces of all types, but in particular for the lapping or polishing of semiconductor wafers which consist, for example, of silicon or of compound semiconductors.

BRIEF DESCRIPTION OF THE DRAWINGS

The invention is explained in more detail below with the aid of two figures and on the basis of the example of a lapping process. The figures show the profile of two process parameters, namely the pressure acting on the workpiece and the quantity of lapping agent supplied, over the course of time. It is to be understood, however, that the drawings are designed as an illustration only and not as a definition of the limits of the invention.

DETAILED DESCRIPTION OF THE PREFERRED EMBODIMENT

Figure 1:
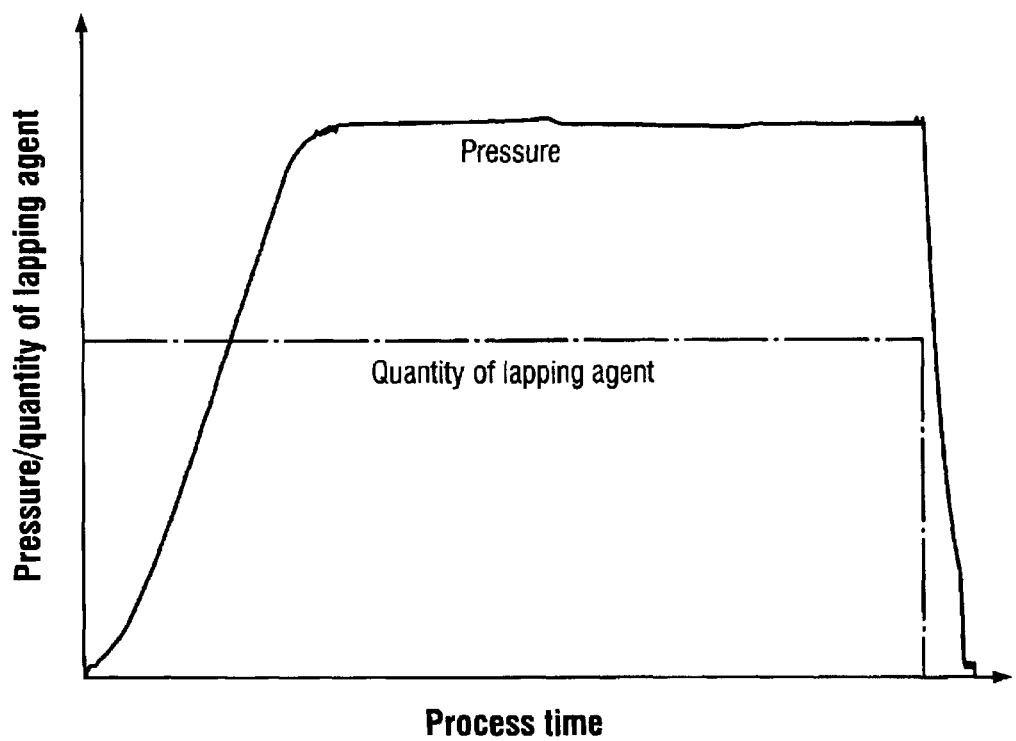
FIG. 1 illustrates the profile of a conventional process.
Figure 2:
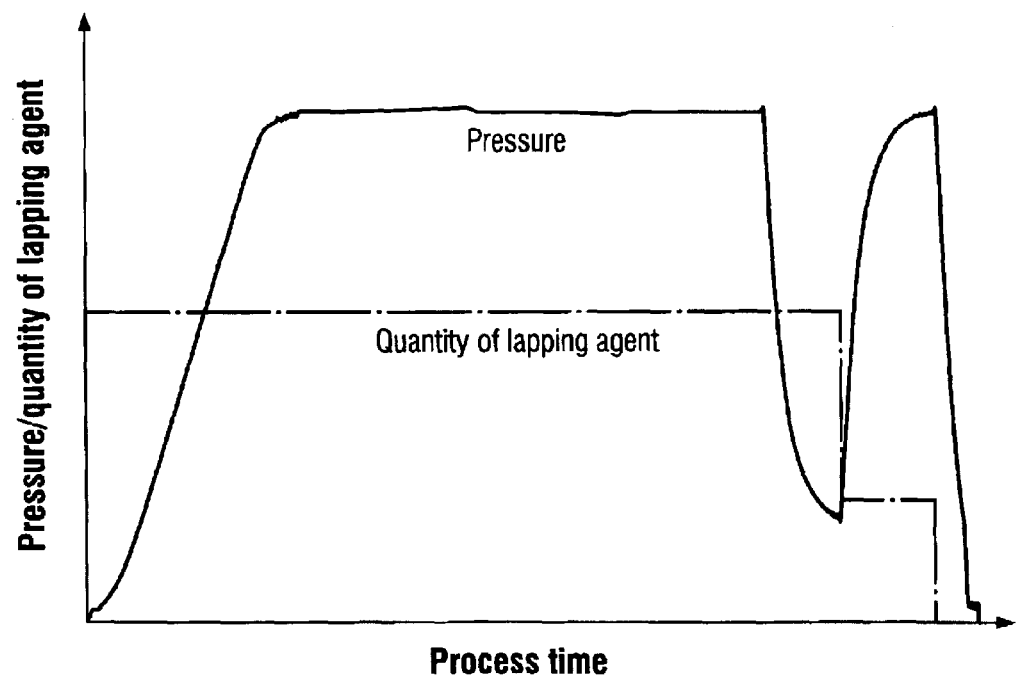
FIG. 2 shows a profile which is typical of a process according to the invention.

The processes shown in FIG. 1 and FIG. 2 can be divided into a starting phase, a main phase and a finishing phase. They differ through the fact that according to the invention, the pressure is significantly reduced and then increased again at least once during the machining of the workpiece, and the supply of the auxiliary substance is reduced as the pressure increases.

In the conventional process shown in FIG. 1, the supply of lapping agent, which is kept constant during a main phase, is stopped in a finishing phase and the pressure acting on the workpiece, starting from the level established during the main phase, is reduced toward zero over a ramp profile.

In the preferred embodiment of the process according to the invention shown in FIG. 2, the pressure acting on the workpiece is significantly reduced at least once for a certain time, preferably 0.5 to 1 min, and then increased again prior to the finishing phase. It is particularly advantageous for the pressure to be reduced by at least 80%, so that the reduced pressure is 20% or less of the level established during the main phase, and for it then to return to this previous level. At the same time as the pressure is being increased, the supply of lapping agent is reduced to 0 to 50% of the level established during the main phase, particularly preferably to 0 to 30%.

COMPARATIVE EXAMPLE AND EXAMPLE

Semiconductor wafers made from silicon were machined using the conventional lapping process. Other semiconductor wafers of the same type were lapped in the same way, except that the pressure and the supply of lapping agent were altered in accordance with the profile according to the invention shown in FIG. 2. The table below shows the results of a flatness measurement which was then carried out, analyzing the local flatness values (GBIR) and the thickness deviation from a target thickness.

TABLE

| | Indices/Parameters | Status (conventional) | Status invention |
|---|---|---|---|
| Geometry data (2 Sigma value) | GBIR [μm] | 1.19 | 0.99 |
| Difference Thickness to target (2 Sigma value) | Thickness [μm] | 7.3 | 6.7 |

Accordingly, while only a single embodiments of the present invention has been shown and described, it is obvious that many changes and modifications may be made thereunto without departing from the spirit and scope of the invention.

What is claimed is:

1. A process for machining a wafer-like workpiece between two plates, in which material is abraded from the workpiece under the influence of an auxiliary substance supplied and of a pressure acting on the workpiece, the process comprising:

reducing the pressure on the workpiece;

then increasing the pressure at least once during machining of the workpiece; and reducing a supply of the auxiliary substance as the pressure is increased.

2. The process as claimed in claim 1, wherein the pressure is reduced by at least 80% of its original level.

3. The process as claimed in claim 1, wherein the supply of auxiliary substance is reduced to between 0 and 50% of its original level.

4. The process as claimed in claim 1, wherein the workpiece is machined between a lower working wheel and an upper working wheel of a double-side polishing machine, with a polishing abrasive being supplied.

5. The process as claimed in claim 1, wherein the workpiece is machined between a lower working wheel and a carrier plate of a single-side polishing machine with a polishing abrasive being supplied.

6. The process as claimed in claim 1, wherein the workpiece is machined between a lower working wheel and an upper working wheel of a lapping machine with a lapping abrasive being supplied.

7. The process as claimed in claim 1, wherein the workpiece is a semiconductor wafer.

8. The process as claimed in claim 1, wherein the workpiece is subjected to the process together with other workpieces.

* * * * *